(12) United States Patent
Zarcone (10) Patent No.: US 9,195,088 B2
(45) Date of Patent: Nov. 24, 2015

(54) OPERATING DEVICE FOR AN ELECTRIC APPLIANCE

(75) Inventor: Carmelo Zarcone, Oelbronn (DE)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 200 days.

(21) Appl. No.: 14/007,004

(22) PCT Filed: Mar. 23, 2012

(86) PCT No.: PCT/EP2012/055190
§ 371 (c)(1),
(2), (4) Date: Oct. 1, 2013

(87) PCT Pub. No.: WO2012/127027
PCT Pub. Date: Sep. 27, 2012

(65) Prior Publication Data
US 2014/0016046 A1    Jan. 16, 2014

(30) Foreign Application Priority Data

Mar. 24, 2011    (DE) .................. 10 2011 006 021

(51) Int. Cl.
*G02F 1/1333* (2006.01)
*A47L 15/42* (2006.01)
(Continued)

(52) U.S. Cl.
CPC ......... *G02F 1/13338* (2013.01); *A47L 15/4293* (2013.01); *B60K 35/00* (2013.01);
(Continued)

(58) Field of Classification Search
CPC .............. A47L 15/4293; D06F 39/005; D06F 2058/2883; F24C 7/082; H03K 17/9622; H03K 2017/9602; H03K 2217/960775; H03K 2217/960785; B60K 35/00; B60K 2350/1028; B60K 2350/2056; G02F 1/13338
USPC ........... 200/5 A, 512–519, 600; 345/173, 176
See application file for complete search history.

(56) References Cited

U.S. PATENT DOCUMENTS 5,917,165 A    6/1999  Platt et al.
7,232,973 B2   6/2007  Kaps et al.
(Continued)

FOREIGN PATENT DOCUMENTS

CN    1790910 A    6/2006
CN    1875543 A    12/2006
(Continued)

OTHER PUBLICATIONS

International Searching Authority, International Search Report for International Application No. PCT/EP2012/055190, Jul. 5, 2012, 6 pages, European Patent Office, The Netherlands.
(Continued)

*Primary Examiner* — Edwin A. Leon
(74) *Attorney, Agent, or Firm* — Alston & Bird (57) ABSTRACT

An operating device for an electric appliance has a plurality of display elements, a plurality of operating elements below a translucent operating surface in order to operate by applying a finger and drawing the finger over the operating surface. The operating elements are flat capacitive sensor elements and together with the display elements have common accommodation housings. The sensor elements are placed on top of the accommodation housings and the display elements are arranged in through-holes in the housings. The operating device has at least two accommodation housings that are arranged next to each other.

16 Claims, 4 Drawing Sheets (51) Int. Cl.
*F24C 7/08* (2006.01)
*H03K 17/96* (2006.01)
*B60K 35/00* (2006.01)
*D06F 39/00* (2006.01)
*D06F 58/28* (2006.01)

(52) U.S. Cl.
CPC ........... *F24C 7/082* (2013.01); *H03K 17/9622* (2013.01); *B60K 2350/1028* (2013.01); *B60K 2350/2056* (2013.01); *D06F 39/005* (2013.01); *D06F 2058/2883* (2013.01); *H03K 2017/9602* (2013.01); *H03K 2217/960755* (2013.01); *H03K 2217/960785* (2013.01)

(56) References Cited

U.S. PATENT DOCUMENTS

| | | | |
|---|---|---|---|
| 7,265,747 | B2 | 9/2007 | Martin |
| 7,786,400 | B2 * | 8/2010 | Baier ........................... 200/600 |
| 8,110,767 | B2 * | 2/2012 | Yamauchi et al. ............ 200/600 |
| 9,048,842 | B2 * | 6/2015 | Dombrowski et al. ............... 1/1 |
| 2002/0167704 | A1 | 11/2002 | Kleinhans et al. |
| 2011/0025643 | A1 | 2/2011 | Dombrowski et al. |
| 2011/0302533 | A1 | 12/2011 | Stuhr et al. |
| 2012/0126834 | A1 | 5/2012 | Kleinhans |

FOREIGN PATENT DOCUMENTS

| | | |
|---|---|---|
| DE | 10361350 A1 | 7/2005 |
| DE | 202006009543 U1 | 12/2007 |
| DE | 102006039133 A1 | 3/2008 |
| DE | 102009021033 A1 | 9/2010 |
| DE | 102009036161 A1 | 2/2011 |
| DE | 102009036162 A1 | 2/2011 |
| EP | 859467 A1 | 8/1998 |
| EP | 1257057 A1 | 11/2002 |
| EP | 2045923 A1 | 4/2009 |
| FR | 2906947 A1 | 4/2008 |
| WO | WO 2010/094796 A1 | 8/2010 |

OTHER PUBLICATIONS

German Patent and Trade Mark Office, Office Action for Application No. 10 2011 006 021.9, Dec. 14, 2011, 4 pages, Germany.

* cited by examiner

Fig. 10 ic Appliance

OPERATING DEVICE FOR AN ELECTRIC APPLIANCE

CROSS REFERENCE TO RELATED APPLICATIONS

This application is a National Stage application, filed under 35 U.S.C. §371, of International Application PCT/EP2012/055190, filed Mar. 23, 2012, which claims priority to German Application No. 10 2011 006 021.9, filed Mar. 24, 2011, both of which are hereby incorporated by reference in their entirety.

TECHNOLOGICAL FIELD

The invention relates to an operating device for an electric appliance having a plurality of display elements, a plurality of operating elements, and a translucent or at least partially transparent or light transmitting operating surface, with display elements and operating elements disposed below the surface.

BACKGROUND

Such operating devices are known from WO 2010/094796 A1, for example. By applying a finger and by drawing an applied finger across, respectively, operation of the electric appliance is achieved. The operating elements detect by well-known ways and means the respective location of the placed-on finger and thus movement thereof. The display elements display a power level set by a finger move, for example.

To implement such a convenient and optically very appealing operating device, either an aforementioned touch screen may be employed, which is very expensive, however, and may not in any case be used in a low number of units with unlimited flexibility. As an alternative, individual operating elements and individual display elements may be employed very flexibly, and be attached to corresponding component supports, for example. However, there is an increased effort entailed, and in particular this means high labor input for mounting.

SUMMARY

The invention is based on the object to provide an above mentioned operating device capable of avoiding the problems of the state of the art, and in particular to provide an efficient and for mass production adapted option, to provide an aforementioned operating device for an electric appliance, in particular a hob.

The object is achieved by an operating device. Advantageous as well as preferred embodiments of the invention are the subject matter of the further claims and will be explained in more detail below. The wording of the claims is incorporated into the contents of the description by explicit reference.

According to the invention, it is provided that the operating elements are flat capacitive sensor elements and together with the display elements have common accommodation housings. Thus, components adapted to quasi modular assembly are provided which, considered separately, are always constructed in a similar manner, and can then be mounted in arbitrary number and arrangement, as the case may be, for example on a component support. Thereby, consistently similar operating devices that are matched in detail can be constructed quasi schematically. Therein, a sensor element is provided on a top surface of the accommodation housing, namely facing the operating surface and resting against the underside of the operating surface pressed on by means of the accommodation housing. The display elements in turn are disposed in through-holes in the accommodation housings, for example, one or two display elements per through-hole. At least two identical accommodation housings are employed with the operating device and arranged next to each other, advantageously three or even four. They may be similar or identical as to the structure of the accommodation housing and always be implemented according to a similar, repeated pattern, respectively, with display elements and sensor elements. One single difference between the adjacent accommodation housings is advantageously merely in that they somewhat differ in the arrangement of the through-holes in the accommodation housing.

The similarity of the accommodation housings is advantageously based on the feature that each of the accommodation housings has an equal number of through-holes that are arranged and structured in similar or corresponding manner. Thus, to particular advantage, there are one, two, or more larger elongated through-holes provided in each case in the center, and adjoining the short outer edges thereof, small exterior through-holes, in particular three or a corresponding number of smaller through-holes. Advantageously, a few closed fields or zones are provided in the center adjacent to the through-holes, however, just as the exterior through-holes, each adjoining a small through-hole. In other words, there are in each case exterior on both sides small through-holes provided, and between every two small through-holes, there is either a large through-hole or a correspondingly large field which advantageously is closed. Advantageously, this is the criterion to measure the similarity; and variance and variation, respectively, are then based on the feature, whether or not with an accommodation housing, there is an open large through-hole disposed between the small through-holes, or a closed field, and how the open large through-holes and the closed fields are distributed, respectively. In the completed arrangement of a plurality of accommodation housings adjacent or adjoining, there is advantageously an alternation of open large through-holes and closed fields in the center, particularly advantageous is that in each case open large through-holes are provided at the ends.

The display elements in the through-holes are shielded one from the other by the accommodation housing as such and the walls thereof or the like, respectively, so that the corresponding through-holes, like luminous fields, luminous symbols and the like, are illuminated and thus are visible through the operating surface. In that context, the luminous effect is affected by the shape design of the through-hole, inter alia. Therein, display elements, preferably in the form of LEDs (light-emitting diodes) advantageously project into the through-holes such that outshining from a through-hole sidewards and into an adjacent through-hole, respectively, is prevented.

In a first general embodiment of the invention, the sensor elements are separate components and produced separate from the accommodation housings. For example, they can be made of flat material, in particular sheet metal or copper sheet, and be produced by fabricating of recesses and bending and deforming, respectively. One option is cutting from sheet metal and bending, in a manner generally known for such sensor elements. To particular advantage, the sensor elements are placed on a top of the accommodation housing, to be supported thereon, and then pressed against the underside of the operating surface. Fixing of the sensor elements can be achieved either by the pressing on, or in that the sensor elements are at least on one side, preferably on two opposite sides, projecting beyond the accommodation housing with lateral projections. The latter can serve for attachment and/or electric contacting. To that, the lateral projections can be bended twice, and thereby reach down to a bottom of the accommodation housing and up to a component support, respectively, where the accommodation housings are disposed. Projections of a sensor element laterally projecting and resting on the component support, can rest on a contact field, and be fixed by soldering, for example, as an alternative also be fixed by a plug connection and contacted electrically. Therein, the sensor elements may even serve for fixing the accommodation housing as such on the component support.

In another embodiment of the invention, it can be provided that one single sensor element is provided per accommodation housing, and one accommodation housing includes or forms but one single sensor element, respectively. Furthermore, it can be provided that the sensor element overlaps or covers a smaller surface area than the top surface of the accommodation housing. Primarily, there should possibly not be zones of the sensor element extending above perforations including display elements therein so that the display function thereof is not impaired. Another option is that radiation from the display elements is passing through cutouts in the sensor element, and the luminous effect is affected by the shape design thereof and the shape design may form a luminous display, respectively.

In an embodiment of the invention, it can be provided that the sensor element essentially overlaps and covers the accommodation housing with the exception of two or three sensor element cutouts. In that context, there should, primarily towards the sides, in each case only sensor element cutouts be provided that are limited and bordered, respectively, by small webs. Consequently, this means that towards the sides through-holes of the accommodation housing with display elements inside are provided and constitute a display function.

An accommodation housing may have a plurality of through-holes in and between a grid-type frame, respectively, so that an accommodation housing per se is essentially configured in a grid type or frame type or divided into fields. Advantageously, an accommodation housing includes three parallel rows of through-holes in a direction of the housing extension, advantageously in the shorter direction. There are two outer rows to the left and to the right of identical through-holes provided, and particularly preferred each includes but one single display element and is approximately square in shape. Interposed may be a central row of through-holes provided, that have a different design and are considerably larger or wider, respectively. For uniform illumination, there may advantageously be more or two display elements provided, and advantageously have a luminosity corresponding to that of the small through-holes.

In another embodiment of the invention, the through-holes including display elements may be provided with light diffusing material and have a diffusor function, respectively. To that end, the display elements may essentially be filled with diffusor material, or in particular include it on the top surface thereof, for example in a kind of disk or filling.

In an embodiment of the invention, three adjoining accommodation housings may be provided, each with separate sensor elements mounted above, particularly advantageous one sensor element per accommodation housing. On both ends of the central row, the through-holes are not overlapped by a sensor element, while the two outer sensor elements project beyond them with a sensor element projection in the direction of extension of the central row, and advantageously can rest on the underside of the operating surface. By the quasi alternating arranged zones of surface area of a sensor element and free through-hole, the sensor element function is thus ensured, for example according to the manner of a so-called slider by means of a plurality of capacitive sensor elements along a line. In the intermediate zones without sensor element with a through-hole, display elements are provided which either display the slider for an operator, or else, as will be explained in more detail below, indicate a symbol or a value of a display which has been set using the operating device.

This is advantageous to allow that the sensor elements actually cover some of the through-holes of the central row, namely in particular every second through-hole. The through-holes of the two outer rows to the left and to the right of the central row always remain essentially free, so that therein display elements can be arranged in the through-holes. Admittedly, there is no concurrent operating element function available here. The sensor elements extend with small webs between the through-holes of the outer rows outwards for electric contacting and mechanical fixing, respectively.

The through-holes of the central row may advantageously be significantly wider than the through-holes of the outer two rows. The difference can amount up to a factor of 2 to 5 fold, advantageously 2 to 3 fold. In the longitudinal direction of the arrangement of the three accommodation housings, that is quasi virtually in the operating direction of the slider, the through-holes in all rows may be equal in length. With such a configuration of the operating device, the elongated central through-holes and the short outer through-holes are capable of representing and reproducing, respectively, seven-segment displays (SSD), in particular with a run function in the operating direction of the slider and in the longitudinal direction of the three adjacent accommodation housings, respectively.

In a basically different embodiment of the invention, the accommodation housings are made of electrically conductive material, for example hard or soft synthetic material including corresponding additives. The housings rest with their top against the underside of the operating surface, wherein again a plurality of accommodation housings are adjoining. Each can be electrically separated from another by insulation. The top surfaces of the electrically conductive accommodation housings constitute the above mentioned sensor elements and operating elements, respectively.

The above mentioned insulation may, for example, be an insulation layer applied permanently to a housing exterior wall, for example also in the form of an adhesive layer or an adhesive strip. As an alternative, it can be an insulating coating or an insulating layer sprayed on using a multicomponent injection molding procedure. Even in the second general embodiment of the invention an accommodation housing may generally be designed similar to the above description, that is, comprise a plurality of through-holes and thus a grid-type shape or frame-type shape. Again, there may be a plurality, preferably three parallel rows of through-holes provided. With three rows of through-holes, two outer rows have identical through-holes, for example with an approximately square shape. A central row of through-holes is located in between, wherein actually in the respective through-holes at least one display element is disposed.

In the above described case, the through-holes of the central row may advantageously be significantly wider than the through-holes of the two outer rows. For example, they may be two-fold to five-fold as wide and include two or three display elements for uniform illumination, wherein preferably the illumination in relation to the surface area is correspondent to that of the smaller through-holes. Advantageously, all the through-holes in the extension direction of the three rows are equal in length.

In general, according to the invention the accommodation housings may extend in parallel to the operating surface and be flat. In a plan view, they advantageously exhibit a rectangular shape with a width that is one-and-a-half-fold to three-fold as wide as their length. Therein, the accommodation housings rest against another with their longer sides such that with a plurality of adjoining accommodation housings, there is an arrangement provided which in the direction is in total longer than the width thereof.

Advantageously, the accommodation housings are placed on component supports, for example circuit boards. The component supports also bear the display elements and contact them electrically, for example LEDs or SMD-LEDs. Even the sensor elements are led to the component support and electrically contacted thereon. For example, sensor element projections projecting laterally beyond the accommodation housings may be used, as already mentioned above. They can be placed on corresponding contact fields and fixed by soldering, and as an alternative be inserted in holes or in plug sockets.

These and further features will become apparent both from the claims and also from the description and the drawings, wherein the individual features can each be implemented as one or more in the form of sub-combinations in an embodiment of the invention and in other fields, and present advantageous embodiments that are patentable per se, and for which protection is claimed herein. The subdivision of the application in individual sections and intermediate headlines does not limit the universality of the statements given thereunder.

BRIEF DESCRIPTION OF THE SEVERAL VIEWS OF THE DRAWINGS

Exemplary embodiments of the invention are diagrammatically illustrated in the drawings and will be explained in more detail in the following. In the drawings show.

DETAILED DESCRIPTION

Figure 1:
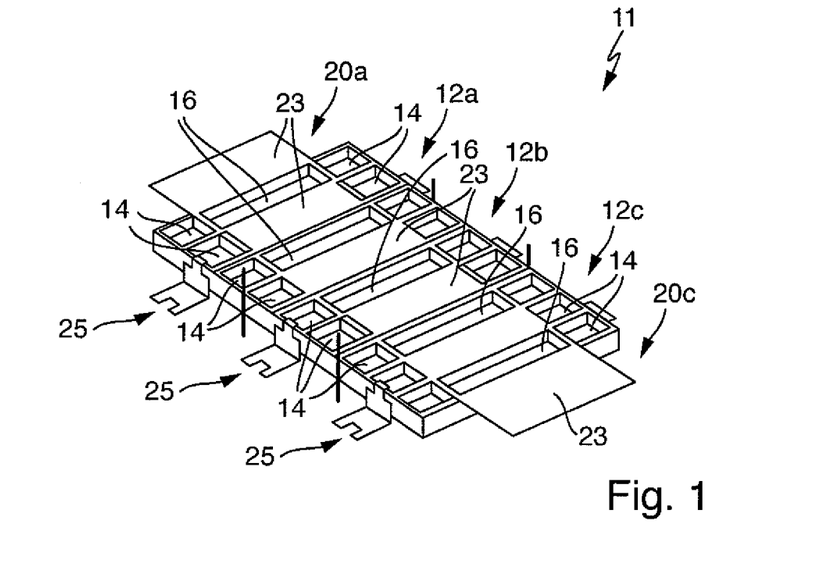
FIG. 1 an oblique view of an operating device with operating elements and display elements on accommodation housings.

In FIG. 1, an operating device 11 according to the invention is illustrated in an oblique view, and composed of or comprising three accommodation housings 12a, 12b, and 12c. The housings are made of electrically insulating synthetic material and are interconnected to form a structural unit, for example by adhesive bonding in the case of synthetic material components. The parting lines between the individual accommodation housings are illustrated by lateral thick lines. The accommodation housings 12 each have, as will become clearer from the following figures, in particular from FIG. 8 of a similar configuration, on the left and on the edge, corresponding to the above described front and rear end, in each case small through-holes 14, designed to be approximately square, namely in each case three through-holes 14 per side of an accommodation housing 12. Further apertures are provided on the accommodation housings 12 between the through-holes 14 and a central zone. With the accommodation housing 12b, this is a central elongated through-hole 16. The hole is located between the two central through-holes 14, while the accommodation housing 12b has a solid zone 15 between the other through-holes 14.

The accommodation housings 12a and 12c each do not have elongated through-holes 16 between the central through-holes 14, but solid zones 15. However, between the upper small through-holes 14 and the lower small through-holes 14, there are two elongated through-holes 16 provided, which are two-times to three-times as long as the small through-holes 14 and have the same width.

Figure 2:
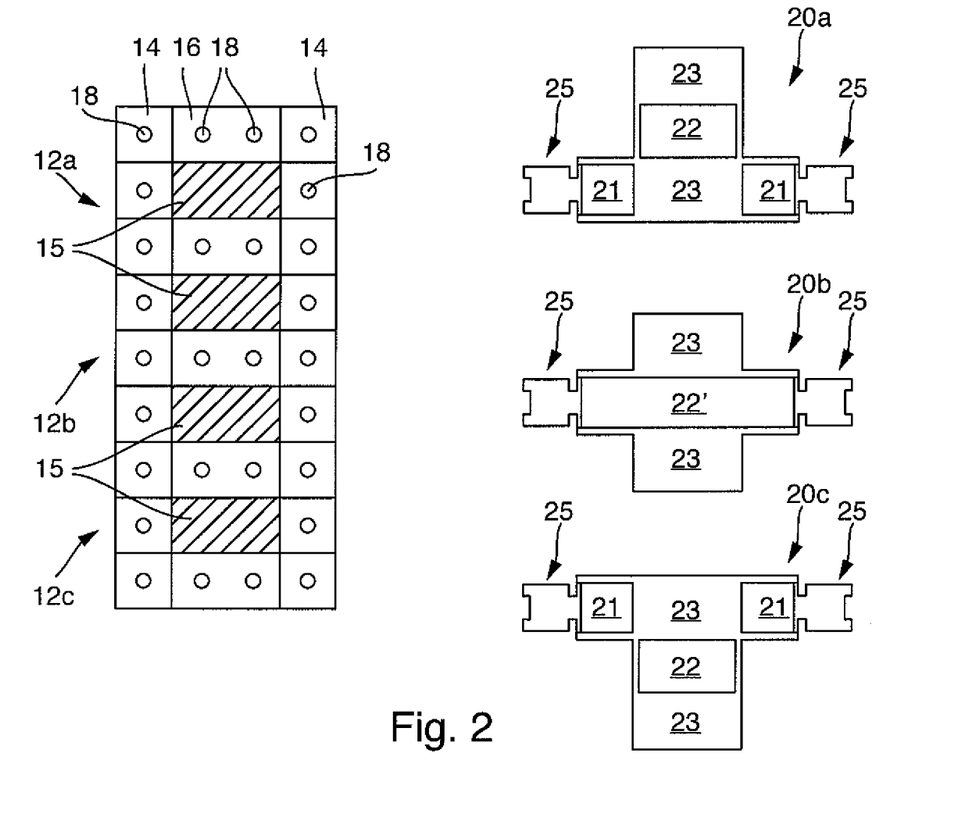
FIG. 2 a plan view on the operating device of FIG. 1 with operating elements drawn to the right in the form of flat sensor elements, illustrating the grid-type and field-type division of the operating device and the accommodation housings, respectively.

In the plan view of FIG. 2, on the left, there is a field-type or grid-type division of the accommodation housings 12 clearly visible. Furthermore, LEDs 18 are symbolized therein and serve as display elements to implement the display of the operating device. In each small through-hole 14, there is one LED 18 disposed, in the elongated through-holes 16 are disposed in each case two LEDs 18. The LEDs allow uniform illumination so that essentially rectangular illumination fields are visible to the top.

In FIG. 2 the respective sensor elements 20a-c are illustrated drawn to the right adjacent to the accommodation housings 12a-c in a plan view, the same as those included in FIG. 1. An upper sensor element 20a is made of thin sheet metal, copper sheet, for example, the same as the other sensor elements 20b and 20c. It has two small perforations 21 corresponding to the above sensor element cutouts and which later will be located above the small through-holes 14. Furthermore, it has an elongated perforation 22 in the central zone, located above an elongated through-hole 16, as apparent from FIG. 1. As a result, the sensor element 20 essentially forms two sensor areas 23 electrically connected to another by production in one piece. The narrow zones around the small perforations 21 serve merely for electrical contacting to the side, what will be described in more detail below. Beyond the small perforations 21, the sensor element 20a has in each case one retaining foot 25, bended downwards according to FIG. 1, and serving both for electrical contact and possibly for fixation, as will be explained in more detail in the following.

The sensor element 20c is designed similar to the sensor element 20a, but actually turned downwards by 180° in the plane of projection.

Another sensor element 20b has a somewhat different design and includes only one single elongated perforation 22' which was produced quasi in that the elongated perforation 22 is inserted exactly between the two small perforations 21 in the sensor element 20a. The upper sensor area 23 instead is transferred to the lower side of the elongated perforation 22' so that a configuration in longitudinal symmetry is obtained. This means that the elongated perforation 22' is continuously extended over small through-holes 14 arranged in a row with an elongated through-hole 16 in between, and thus exposes the four LEDs 18 below arranged in a row. With the sensor element 20b as well, there are retaining feet 25 provided exterior to the perforation 22'.

A combined consideration of FIG. 1 and FIG. 2 on the left reveals also that the operating device 11 according to the invention allows providing a kind of matrix display similar to a seven-segment display, but with significantly finer subdivision. Namely, there are 23 segments present in the form of through-holes 14 and 16 including a total of 28 LEDs 18, and each through-hole 14 and 16 and each field, respectively, can be controlled autonomously. Thereby, figures or characters can be displayed, not only according to a seven-segment display, as will be explained in more detail below, but there is even a kind of running display or ticker writing feasible, as will be explained in more detail below.

Figure 3:
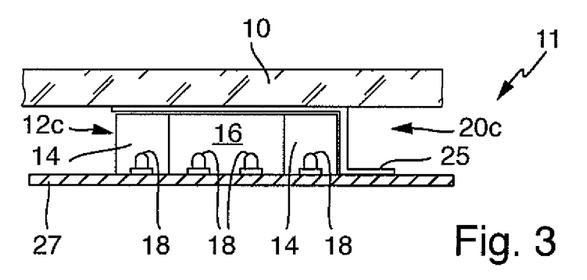
FIG. 3 a section through the operating device of FIG. 1 in the installed condition in an electric appliance.

In FIG. 3 a section through an operating device 11 according to the invention in an electric appliance is shown, for example using a glass ceramic plate 10 as a hob and operator control panel. Therein, on a circuit board 27 the LEDs 18 are disposed in the small through-holes 14 and the elongated through-hole 16, respectively. Indeed, a sensor element 20 is extended over the corresponding accommodation housing 12, however, directly above the through-holes 14 and 16, respectively, and thus also the LEDs 18 with cutouts, for example the elongated perforation 22' with sensor element 20b. Thus, the sensor element 20 will not interfere with the upward illuminating effect of the LEDs 18, or merely inessentially at the edge.

The arrangement of FIG. 3 may be configured such that the operating device 11 with the sensor element 20b rests on the underside of the glass ceramic plate 10. The accommodation housings 12 may either be adhesively bonded to the circuit board 27, or attached by other retaining means. Another option is, to secure them by means of the sensor elements 20. Namely, a retaining foot 25 of the sensor element 20b is provided for that purpose on the top of the circuit board 27, and may there be fixed by soldering, for example on a contact field, for electric contacting and mechanical fixation.

The illustration of FIG. 1 also demonstrates that the operating device 11 has six sensor areas 23 in a line, that is, two sensor areas 23 per accommodation housing 12. Adjacent sensor areas have a free surface area there between, presenting approximately the same size, and with an elongated through-hole 16 located below it. Each of the sensor areas 23 are like one even in relation to electric characteristics and in each case constitute a capacitive sensor element, as apparent from FIG. 3.

Figures 4, 5:
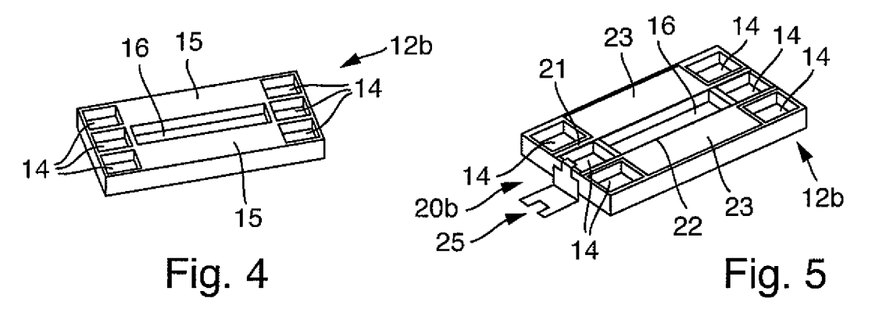
FIG. 4 an individual central accommodation housing according to the operating device of FIG. 1 in an oblique view.
FIG. 5 the accommodation housing of FIG. 4 with placed-on central sensor element according to FIG. 2.

In FIG. 4, an individual accommodation housing 12b is illustrated, to further demonstrate the configuration including small through-holes 14 and elongated through-holes 16. In FIG. 5, the accommodation housing 12b of FIG. 1 is illustrated with a sensor element 20b placed-on. A direct comparison reveals that the sensor areas 23 of the sensor element 20b are located above the solid zones 15 of the accommodation housing 12b above and below the elongated through-holes 16. The central small through-holes 14 are also open to the top, due to the length of the elongated perforation 22' in the sensor element 20b. The small through-holes 14 in the corners are neither covered nor bordered by the sensor element 20b, anyway.

Figure 6:
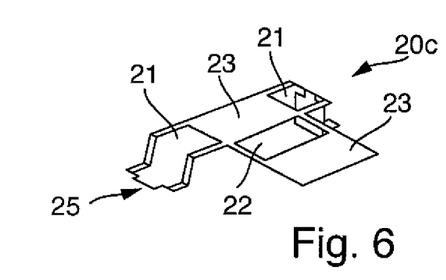
FIG. 6 an oblique view of the lower sensor element of FIG. 2.

In FIG. 6, the sensor element 20e is again illustrated in an oblique view, as indicated above. It is apparent here as well that the sensor element 20c is produced by cutting and deforming and bending, respectively of one single sheet metal component, wherein mainly the two sensor areas 23 remain, and then act as a capacitive sensor element having two distributed areas. Equally, the small through-holes 14 and the elongated through-hole 16 are identified that allow radiation of the LEDs 18 to the top.

Figure 7:
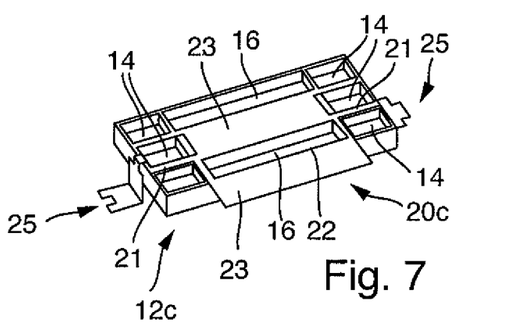
FIG. 7 an oblique view similar to FIG. 5 of the lower accommodation housing with placed-on central sensor element according to FIG. 6.

FIG. 7 illustrates how the sensor element 20c is placed on an accommodation housing 12c. As mentioned above, the upper sensor area 23 is located above the solid zone of the accommodation housing 12c which according to FIG. 2 does not include an LED anyway. The lower elongated through-hole 16 is located below the elongated perforation 22 to allow radiation passing, and the central small through-holes 14 are located similarly below the small perforations 21 to allow radiation passing. The lower sensor area 23 projects downwards beyond the accommodation housing 12c, see also FIG. 1.

Figure 8:
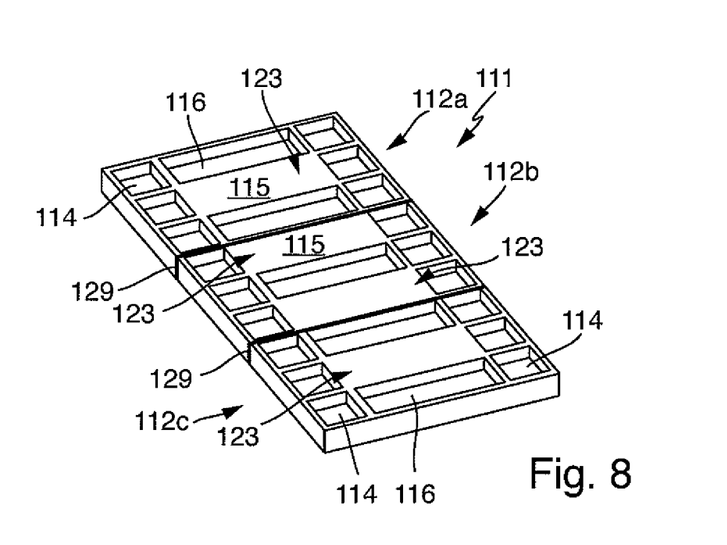
FIG. 8 a variant of the operating device similar to FIG. 1 with three accommodation housings made of electrically conductive synthetic material and electrically separated by means of insulations.

In FIG. 8, an alternative operating device 111 is illustrated and as well comprises three accommodation housings 112a, 112b, and 112c. The housings are in relation to geometry designed similar to the illustrations in FIGS. 1, 2, 4, 5, and 7. However, a difference is in that they are made of relatively hard electrically conductive synthetic material, and actually are also interconnected and adhesively bonded, respectively. Optionally, the electric conductivity may also be obtained by a corresponding electrically conductive coating, covering advantageously at least the top surfaces, and with particular advantage reaches downwards for electrical contacting. Interposed between the individual accommodation housings 112a to 112c are, however, two insulations 129, for example also as an insulating double-faced adhesive tape or adhesive material. Since the accommodation housings 112a-c per se are electrically conductive, they equally constitute capacitive sensor elements, in particular with the solid zones 115, which then would directly rest on the underside of the glass ceramic plate, according to FIG. 3, what is well-known to be decisive for the function of a capacitive sensor element for a contact switch, see EP 859 467 A, for example. However, since there are herein no projecting sensor areas according to FIG. 1 or 7 illustrated, the operating device 111 of FIG. 8 has only four sensor areas 123 that actually are constituted by the solid zones 115. Optionally however, there may be additional wing-type prolongations corresponding to the outmost sensor areas 23 according to FIG. 1 provided on the accommodation housings 112a and c.

FIG. 8 also shows, like for instance according to the other figures, that two different types of accommodation housings have to be provided, even without separate sensor elements made of sheet metal or the like.

Figure 9:
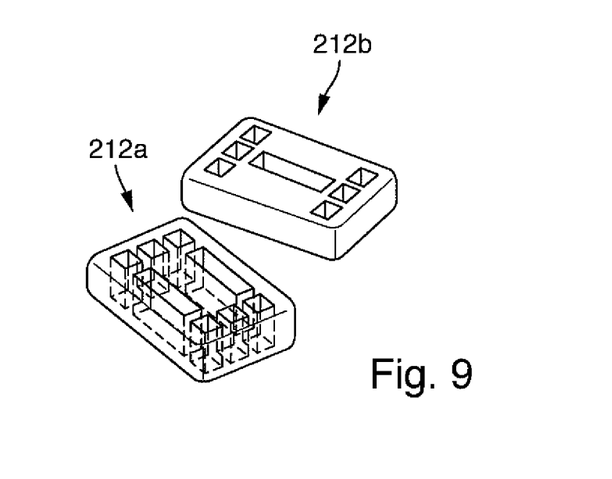
FIG. 9 individual accommodation housings similar to FIG. 8 made of electrically conductive synthetic foam material that yet have to be electrically insulated one from the other during assembly.

In FIG. 9 another example of the accommodation housings 212a and 212b is illustrated. The housings are generally similar to those of FIG. 8, however, they are not made of hard synthetic material, but of soft and elastic, respectively, synthetic material, for example foamed synthetic material. In the figures this is illustrated in that the corners and edges are somewhat more rounded. In the other respects, the three accommodation housings 212a and 212b may be configured and be assembled according to FIG. 8.

Figure 10:
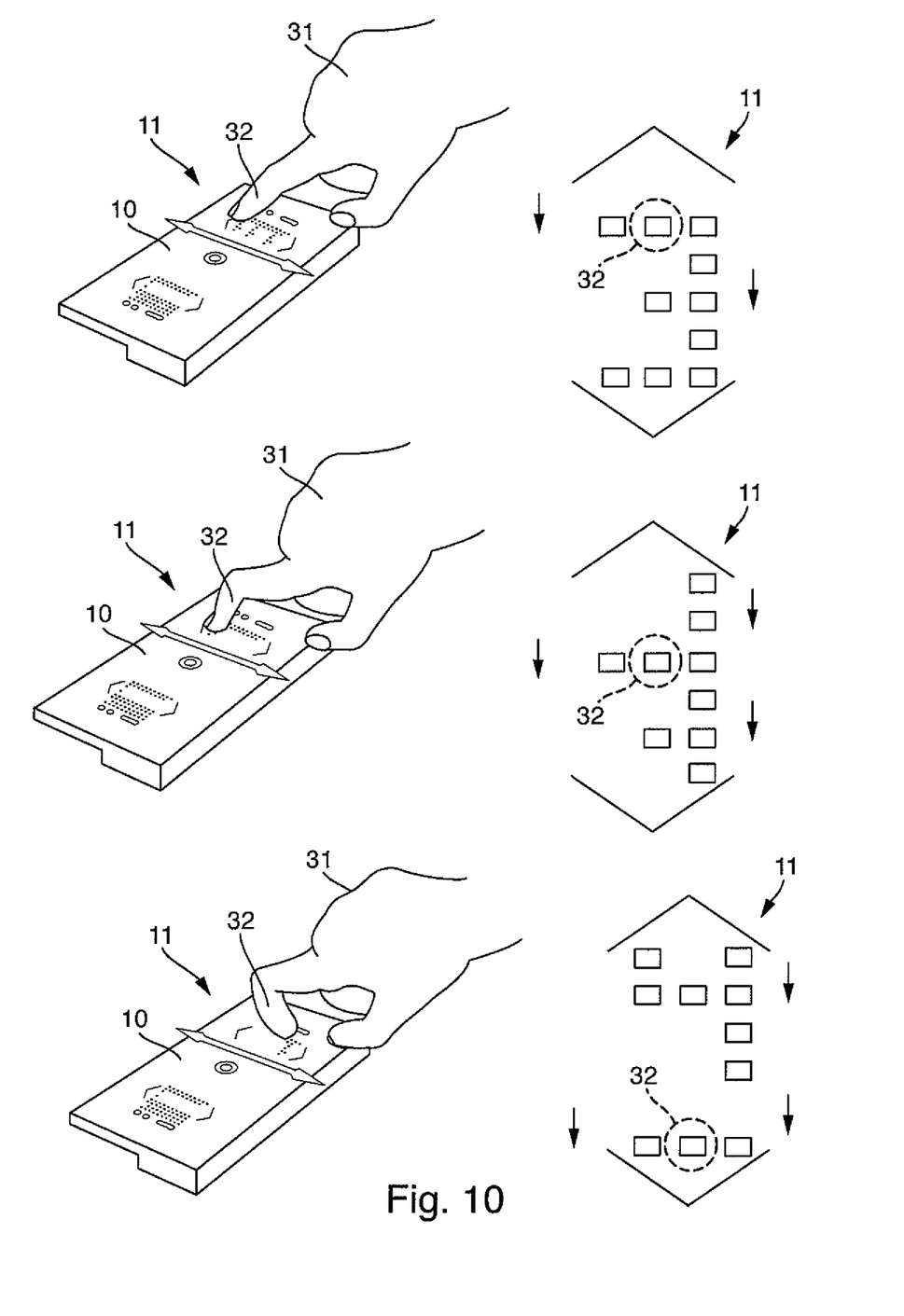
FIG. 10 a procedure of an operation method, wherein a finger is drawn across the operating device and in response thereto the display varies accordingly, as illustrated on the right hand side.

In FIG. 10 is illustrated, how an operating device 11 according to FIG. 1 can be operated in the installed condition below a glass ceramic plate 10 according to FIG. 3 or the like.

A hand 31 and a finger 32 touch the operating device 11 above the display by the LED 18, which actually is setting a "3", as illustrated on the right side on top. The "3" is formed by short and elongated illuminated symbols corresponding to the small through-holes 14 and elongated through-holes 16, wherein the LEDs 18 are located. It is apparent that on the right side, there are five small through-holes 14 superimposed and illuminated, that is, even more through-holes or illuminated symbols may be generated both upwards and downwards. A circle shown in dashed lines indicates the location where the finger 32 is placed-on and moves downwards according to the thin arrow shown on the left side. The result is a movement of the numeral "3" according to the thick arrow shown on the right side.

On the left side of the median illustration is shown, how the finger 32 is moved downwards in a drawing or brushing motion and thereby quasi the "3" moves downwards, wherein concurrently from above a next numeral, namely the "4", is entering the image, what is also indicated by a thick arrow on the right side. There can also a so-called slider operator control movement of the finger 32 be obtained by the sensor areas 23 of the sensor elements 20 with six of them disposed in a row, all of them arranged and configured actually like a well-known slider as mentioned above. Furthermore, according to the drawing operator control movement, even the indicated numeral can be moved by an operating device including a display in a simple configuration.

In FIG. 10 on the left side bottom is illustrated, how the finger 32 has reached the bottom end using the operating device 11. In the functional illustration adjoining to the right side, the feature is illustrated once again. Furthermore, it is apparent that the previous numeral "3" has almost completely disappeared from the field of view, and the display has disappeared downwards, respectively, while the next numeral "4" has appeared almost completely.

With the method of operation it may be provided that the next numeral "4" enters automatically in a central location on the display, even if the finger movement does not reach as far as needed. The "4" is then both displayed and supplied via the operating device 11 to a control unit for a corresponding functional unit of the electric appliance, a cooking zone of an electric hob, for example.

The invention claimed is:

1. An operating device for an electric appliance comprising:
    a plurality of display elements,
    a plurality of operating elements, and
    a translucent operating surface, with the display elements and operating elements disposed below the surface, for operation by applying a finger and by drawing an applied finger across,
    wherein the operating elements are flat capacitive sensor elements and together with the display elements have common accommodation housings, the sensor elements provided on the top surfaces facing the operating surface, wherein the display elements are arranged in through-holes in the accommodation housings, wherein the operating device has at least two adjacent accommodation housings selected from a group of two similar accommodation housings, wherein one accommodation housing has a plurality of through-holes in and between a grid-type frame, respectively, and wherein three parallel rows of through-holes are provided and therein two outer rows have identical through-holes with a central row of through-holes interposed.

2. The operating device according to claim 1, wherein the sensor elements are components separate from the accommodation housings and made of flat sheet metal, wherein the sensor elements are placed on a top surface of the accommodation housing and pressed on the top surface against the underside of the operating surface.

3. The operating device according to claim 1, wherein sensor elements are projecting at least on one side, on two opposite sides, beyond an accommodation housing with lateral projections for attachment and electric contacting, wherein the lateral projections are bent twice down to a bottom of the accommodation housing and a component support, respectively, where the accommodation housings are disposed and protrude laterally therefrom.

4. The operating device according to claim 1, wherein one single sensor element is provided per accommodation housing, wherein the sensor element overlaps a smaller surface area than the top surface of the accommodation housing.

5. The operating device according to claim 4, wherein the sensor element essentially overlaps and covers the accommodation housing with the exception of two or three sensor element cutouts and perforations, respectively, wherein the sensor element towards the sides has in each case only sensor element cutouts and perforations, respectively, that are limited and bordered, respectively, by small webs.

6. The operating device according to claim 1 further comprising three adjoining accommodation housings with separate sensor elements mounted above, wherein on both ends of the central row the through-holes are not overlapped by a sensor element and the two outer sensor elements project beyond with a sensor element projection in the direction of extension of the central row and rest on the underside of the operating surface.

7. The operating device according to claim 1, wherein the sensor elements overlap every second through-hole of the central row, while the through-holes of the two outer rows always remain free, and the sensor elements extend outwards with small webs between the through-holes of the outer rows.

8. The operating device according to claim 1, wherein the through-holes of the central rows are two-fold to five-fold wider than the through-holes of the two outer rows, wherein all the through-holes of all rows are equal in length.

9. The operating device according to claim 1, wherein the accommodation housings are made of electrically conductive synthetic material and rest with their top against the underside of the operating surface, wherein between two adjoining accommodation housings a separating insulation is provided, wherein the insulation includes an insulation layer applied permanently to a housing wall.

10. The operating device according to claim 9, wherein an accommodation housing has a plurality of through-holes in and between an upper grid-type frame, respectively, wherein three parallel rows of through-holes are provided and therein two outer rows have identical through-holes with a central row of through-holes interposed, wherein light-emitting diode display elements are disposed in the through-holes.

11. The operating device according to claim 10, wherein the through-holes of the central row are two-fold to five-fold wider than the through-holes of the two outer rows, wherein all the through-holes of all rows are equal in length.

12. The operating device according to claim 10, wherein with an accommodation housing the two outer rows of through-holes have three through-holes, wherein the central row has less through-holes.

13. The operating device according to claim 1, wherein the accommodation housings extend in parallel to the operating surface and are flat, wherein the accommodation housings are rectangular with a width that is one-and-a-half-fold to three-fold as wide as their length, wherein the accommodation housings rest against another with their longer sides.

14. The operating device according to claim 1, wherein the accommodation housings are placed on component supports, wherein the component supports are bearing and electrically contacting the display elements, and wherein the sensor elements are electrically contacting on the component support, with portions laterally projecting beyond the accommodation housings.

15. An operating device for an electric appliance comprising:
   a plurality of display elements,
   a plurality of operating elements, and
   a translucent operating surface, with the display elements and operating elements disposed below the surface, for operation by applying a finger and by drawing an applied finger across,
   wherein the operating elements are flat capacitive sensor elements and together with the display elements have common accommodation housings, the sensor elements provided on the top surfaces facing the operating surface, wherein the display elements are arranged in through-holes in the accommodation housings, wherein the operating device has at least two adjacent accommodation housings selected from a group of two similar accommodation housings, wherein the accommodation housings are made of electrically conductive synthetic material and rest with their top against the underside of the operating surface, wherein between two adjoining accommodation housings a separating insulation is provided, and wherein the insulation includes an insulation layer applied permanently to a housing wall.

16. An operating device for an electric appliance comprising:
   a plurality of display elements,
   a plurality of operating elements, and
   a translucent operating surface, with the display elements and operating elements disposed below the surface, for operation by applying a finger and by drawing an applied finger across,
   wherein the operating elements are flat capacitive sensor elements and together with the display elements have common accommodation housings, the sensor elements provided on the top surfaces facing the operating surface, wherein the display elements are arranged in through-holes in the accommodation housings, wherein the operating device has at least two adjacent accommodation housings selected from a group of two similar accommodation housings, wherein the accommodation housings are placed on component supports, wherein the component supports are bearing and electrically contacting the display elements, and wherein the sensor elements are electrically contacting on the component support, with portions laterally projecting beyond the accommodation housings.

\* \* \* \* \*